United States Patent
Verdant (10) Patent No.: US 9,553,124 B2
(45) Date of Patent: Jan. 24, 2017

(54) CMOS IMAGE SENSOR WITH SIGMA-DELTA TYPE ANALOG-TO-DIGITAL CONVERSION

(71) Applicant: Commissariat à l'énergie atomique et aux énergies alternatives, Paris (FR)

(72) Inventor: Arnaud Verdant, Saint-Nazaire-les-Eymes (FR)

(73) Assignee: Commissariat a l'energie atomique et aux energies alternatives (FR)

(*) Notice: Subject to any disclaimer, the term of this patent is extended or adjusted under 35 U.S.C. 154(b) by 0 days.

(21) Appl. No.: 14/939,852

(22) Filed: Nov. 12, 2015

(65) Prior Publication Data
US 2016/0141327 A1    May 19, 2016

(30) Foreign Application Priority Data
Nov. 13, 2014   (FR) ...................... 14 60948

(51) Int. Cl.
| | |
|---|---|
| H03M 3/00 | (2006.01) |
| H01L 27/146 | (2006.01) |
| H04N 5/3745 | (2011.01) |
| H04N 5/378 | (2011.01) |

(52) U.S. Cl.
CPC ... H01L 27/14643 (2013.01); H01L 27/14612 (2013.01); H01L 27/14636 (2013.01); H03M 3/394 (2013.01); H04N 5/378 (2013.01); H04N 5/37455 (2013.01); H03M 3/458 (2013.01)

(58) Field of Classification Search
CPC ............ H03M 3/30; H03M 3/39; H03M 3/43; H03M 3/46; H03M 3/56; H03M 3/33; H03M 3/462; H03M 3/424; H03M 3/456; H03M 3/474; H03M 3/418; H03M 3/394; H03M 3/458
USPC .................................................. 341/143–155
See application file for complete search history.

(56) References Cited

U.S. PATENT DOCUMENTS

| | | | | |
|---|---|---|---|---|
| 5,151,046 | A | * 9/1992 | Korsunky | .............. H01R 12/83 439/326 |
| 5,239,032 | A | * 8/1993 | Yamada | ................ C08F 290/06 522/152 |
| 5,248,971 | A | * 9/1993 | Mandl | ................... H03M 3/474 341/141 |
| 5,461,425 | A | * 10/1995 | Fowler | ................... H04N 3/155 250/208.1 |
| 5,886,659 | A | 3/1999 | Pain et al. | |

(Continued)

OTHER PUBLICATIONS

"French Search Report," issued on Apr. 28, 2015, in French counterpart Patent Application No. 1460948.

(Continued)

*Primary Examiner* — Lam T Mai
(74) *Attorney, Agent, or Firm* — Kaplan Breyer Schwarz & Ottesen, LLP (57) ABSTRACT

A CMOS image sensor including a plurality of pixels, each including: a photodiode; a sigma-delta modulator of order p, p being an integer greater than or equal to 1, capable of delivering a binary digital signal representative of the illumination level of the photodiode; and a configurable connection circuit enabling to couple the sigma-delta modulator of the pixel to a sigma-delta modulator of another pixel, so that the modulators of the two pixels form with each other a sigma-delta modulator of order greater than p.

14 Claims, 3 Drawing Sheets

(56) References Cited

U.S. PATENT DOCUMENTS

| | | | | |
|---|---|---|---|---|
| 6,597,371 | B2* | 7/2003 | Mandl | G09G 3/20 341/143 |
| 7,466,255 | B1 | 12/2008 | Ignjatovic et al. | |
| 8,081,098 | B2* | 12/2011 | Yoo | G11C 27/026 341/143 |
| 8,233,068 | B2* | 7/2012 | Chae | H03H 17/0664 348/308 |
| 8,300,116 | B2* | 10/2012 | Kwon | H03M 3/474 341/155 |
| 9,019,139 | B2* | 4/2015 | Mansoorian | H03M 1/1235 341/155 |
| 9,264,643 | B1* | 2/2016 | Xue | H04N 5/3575 |
| 2010/0177213 | A1 | 7/2010 | Yoo et al. | |

OTHER PUBLICATIONS

Johannes Uhlig, et al., "A low-power continuous-time incremental 2nd-order-MASH-modulator for a CMOS imager", "International Conference on Electronics, Circuits, and Systems, 2009. ICECS", Dec. 2009, pp. 33-36, No. 16, Publisher: ICECS; IEEE; ISBN 978-1-4244-5090-9; DOI: 10.1109/ICECS.2009.5410946, Published in: US.

Ignjatovic, et al., "Low Power, High Dynamic Range CMOS Image Sensor Employing Pixel-Level Oversampling Analog-to-Digital Conversion", "Sensors Journal IEEE", Apr. 4, 2012, pp. 737-746, vol. 12, No. 4, Publisher: IEEE; Sensors Council; ISSN :1530-437X; DOI:10.1109/JSEN.2011.2158818.

N. Maghari, et al., "Sturdy MASH A/D modulator", "Electronics Letters", Oct. 26, 2006, vol. 42, No. 22, ; online No. 20062718; Publisher: The Institution of Engineering and Technology; doi: 10.1049/el:20062718.

Peizerat, et al., "Pixel-level A/D conversion: comparison of two charge packets counting techniques", "International Image Sensor Workshop", Jun. 7, 2007, pp. 200-203, Publisher: CEA/LETI—MINATEC; XP002671647, Published in: FR.

P.M. Silva, et al., "Sigma-delta A/D converter for CMOS image sensors", "International Conference on Microelectronics (ICM), 2009", Dec. 19, 2009, pp. 94-97, Publisher: IEEE; XP031631820; ISBN:978-1-4244-5814-1.

* cited by examiner

CMOS IMAGE SENSOR WITH SIGMA-DELTA TYPE ANALOG-TO-DIGITAL CONVERSION

This application claims the priority benefit of French Patent application number 14/60948, filed on Nov. 13, 2014, the contents of which is hereby incorporated by reference in its entirety to the maximum extent allowable by law.

BACKGROUND

The present disclosure generally relates to electronic circuits, and more specifically aims at CMOS image sensors.

DISCUSSION OF THE RELATED ART

Conventionally, a CMOS image sensor comprises a plurality of identical or similar elementary cells or pixels arranged in an array of rows and columns. Each pixel comprises a photodetector, for example, a reverse-biased photodiode, having its junction capacitance discharged by a photocurrent according to a received light intensity. Each pixel further comprises a read circuit capable of delivering an output signal representative of the light intensity received by the photodetector. Conventionally, each pixel delivers, via its read circuit, an analog output signal, for example, a voltage or a current. This signal is then digitized outside of the pixel by an analog-to-digital conversion circuit. The analog-to-digital conversion circuit may be common to a plurality of pixels of the sensor. For example, in the case where the pixels are read from row by row, that is, in the case where all the pixels of a same row are simultaneously read from and where the pixels of different rows are sequentially read from, the sensor may comprise one analog-to-digital conversion circuit per pixel column.

Architectures of CMOS image sensors where each pixel comprises all or part of a sigma-delta type analog-to-digital converter have already been provided. Examples of such architectures are described in articles "Pixel-level A/D conversion: comparison of two charge packets counting techniques", of A. Peizerat et al., called article A hereafter, and "Low-Power, High Dynamic Range CMOS Image Sensor Employing Pixel-level Oversampling ΣΔ Analog-to-Digital Conversion", called article B hereafter, which are herein incorporated by reference.

The general structure of a sigma-delta type analog-to-digital converter will first be reminded. Such a converter typically comprises a sigma-delta modulator receiving an analog input signal to be digitized and outputting, at a relatively high frequency, a sequence of low-resolution intermediate digital samples (typically, binary samples) representative of the input signal. The output of the sigma-delta modulator is coupled to a digital filtering and decimation circuit, which receives the intermediate digital samples output by the modulator, and delivers digital samples of high resolution (higher than the resolution of the output samples of the modulator) representative of the analog input signal, at a frequency lower than the frequency of delivery of the intermediate samples by the sigma-delta modulator. The number of low-resolution samples used to output a high-resolution digital value is generally designated with acronym OSR, for "Over Sampling Ratio".

Conventionally, a sigma-delta modulator of order 1 comprises an analog integrator, typically a capacitance, and, at the integrator output, a low-resolution analog-to-digital converter, typically a 1-bit comparator. The analog input signal of the modulator (the signal to be digitized) is applied to the integrator input, the output of the low-resolution analog-to-digital converter forming the output of the sigma-delta modulator. The output of the low resolution analog-to-digital converter is further coupled to the input of the integrator via a feedback loop comprising a low-resolution digital-to-analog converter. More particularly, the analog signal delivered by the feedback loop is subtracted to the input analog signal at the integrator level, so that the integrator integrates a signal representative of the quantization error of the low-resolution analog-to-digital converter.

Sigma-delta type analog-to-digital converters may be used for various reasons, and particularly because they have a relatively low bulk and electric power consumption, and are robust to non-idealities of components. Further, in the field of image sensors, sigma-delta converters enable to extend the dynamic range of pixels.

In above-mentioned article A, each pixel comprises an asynchronous sigma-delta modulator of order 1, having its integrator formed by a capacitance discharged by a photocurrent generated by the pixel photodiode. The low-resolution analog-to-digital converter is formed of a comparator comparing the voltage across the integration capacitance with a reference voltage, and providing a binary output signal representative of the result of the comparison. The comparator output forms the digital output of the modulator. The comparator output further drives a charge injection circuit which forms the feedback loop of the modulator. More particularly, each time the voltage across the integration capacitance becomes lower than the reference voltage, the comparator output causes the injection of positive charges into the integration capacitance, to recharge the capacitance to a voltage higher than the reference voltage. Two types of feedback circuits are provided in article A, that is, a circuit performing a voltage feedback (the integration capacitance is reset to a predetermined voltage level) and a circuit performing a charge feedback (a predetermined quantity of charges is injected into the integration capacitance). The comparator output is coupled to an asynchronous counter external to the sigma-delta modulator (digital filtering circuit), which counts the number of times that the voltage of the integration capacitance becomes lower than the reference voltage during a pixel integration period.

In an architecture of the type described in article A, due to the asynchronous nature of the sigma-delta modulator, it is in practice necessary for each pixel to comprise its own digital filtering circuit, which raises an issue due to the relatively large bulk of digital counters.

In above-mentioned article B, each pixel comprises a portion only of a sigma-delta modulator of order 1, the other portion of the modulator being common to a plurality of pixels of the sensor. More particularly, in article B, each pixel comprises an integrator, formed by the junction capacitance of the pixel photodiode, and a feedback circuit for resetting the charges of the pixel photodiode, that is, for injecting a predetermined quantity of charges into the photodiode. The low-resolution analog-to-digital converter, a 1-bit comparator, is external to the pixel, and is shared by a plurality of pixels of the sensor. More particularly, in article B, the pixels are selectable in read mode row by row, and the sensor comprises one 1-bit current comparator per pixel column. In each pixel, the analog output of the integrator is coupled to the comparator input via a transistor assembled as a current source (the gate of this transistor being connected to the voltage output of the integrator), a selection transistor, and an output conductive track of the pixel, common to all the pixels in the column. Further, in each pixel, a control node of the feedback circuit is coupled to the digital (binary)

output of the comparator via a conductive track common to all the pixels in the column. The charge injection circuit forms the low-resolution digital-to-analog converter of the feedback loop of the sigma-delta modulator. The sensor further comprises one filtering circuit per pixel column, downstream of the 1-bit comparator of the column.

In article B, the sigma-delta modulators have a synchronous operation, that is, the low-resolution analog-to-digital converter is driven by a clock signal, the binary output of the low-resolution converter being capable of switching state only on a pulse or an edge of the clock signal.

A disadvantage of the architecture described in article B is that the output signals of the pixels are analog signals (currents) and thus have a relatively low robustness to parasitic disturbances.

Further, another disadvantage of the architecture described in article B is that the rate at which the output data of the pixels are read is relatively high. As an illustration, to generate digital output samples over 10 bits with a satisfactory signal-to-noise ratio, an OSR in the order of $2^{10}=1,024$ should be provided (that is, 1,024 read operations per pixel). In the case of a 500-row sensor where the pixels are read from row by row, and for an acquisition frequency of 50 images per second, the row scan frequency then is in the order of $f=50*500*2^{10}=25.6$ MHz. Such a read frequency results in a relatively high electric power consumption, and may cause reading errors, particularly in the case of an architecture of the type described in article B, where the pixel output signals are analog signals.

It would be desirable to have a sigma-delta analog-to-digital conversion CMOS image sensor, this sensor overcoming all or part of the disadvantages of existing sensors.

SUMMARY

Thus, an embodiment provides a CMOS image sensor comprising a plurality of pixels, each comprising: a photodiode; a sigma-delta modulator of order p, p being an integer greater than or equal to 1, capable of delivering a binary digital signal representative of the illumination level of the photodiode; and a configurable connection circuit enabling to couple the sigma-delta modulator of the pixel to a sigma-delta modulator of another pixel, so that the modulators of the two pixels form with each other a sigma-delta modulator of order greater than p.

According to an embodiment, the pixels are distributed in groups of q pixels, q being an integer greater than or equal to 2, the pixels of a same group being interconnected and the circuit for connecting the pixels of a same group being capable of being configured to couple the modulators of order p of the pixels in the group so that the modulators form together a sigma-delta modulator of order q*p.

According to an embodiment, in each pixel, the sigma-delta modulator of order p of the pixel comprises an analog integrator comprising the photodiode of the pixel.

According to an embodiment, in each pixel, the sigma-delta modulator of order p comprises an analog-to-digital converter of an analog output signal of the analog integrator of the pixel.

According to an embodiment, in each pixel, the analog-to-digital converter comprises a comparator comparing said output signal with a reference signal.

According to an embodiment, in each pixel, the sigma-delta modulator of order p comprises a feedback circuit connecting an output node of the analog-to-digital converter to a node of the analog integrator of the pixel.

According to an embodiment, in each pixel, the feedback circuit is capable of injecting a predetermined quantity of charges into the analog integrator of the pixel.

According to an embodiment, the charges are of a sign opposite to that of the photogenerated charges stored in the photodiode of the pixel.

According to an embodiment, in each pixel, the feedback circuit comprises first, second, and third P-channel MOS transistors series-connected between the node of the analog integrator of the pixel and a node of application of a first control signal.

According to an embodiment, in each pixel, the control gates of the second and third P-channel MOS transistors are respectively coupled to first and second bias potentials.

According to an embodiment, in each pixel, the control gate of the first P-channel MOS transistor is coupled to a node of application of a second control signal and to said output node of the analog-to-digital converter via a logic gate.

According to an embodiment, in each pixel, the connection circuit is capable of injecting, onto a node of the analog integrator of the pixel, a quantity of charges representative of an output signal of the analog integrator of another pixel of the sensor.

According to an embodiment, in each pixel, the connection circuit comprises first, second, and third N-channel MOS transistors series-connected between the output node of the analog integrator of the pixel, and a node of application of a third control signal.

According to an embodiment, in each pixel, the control gates of the second and third N-channel MOS transistors are respectively coupled to a third bias potential and to a node of an analog integrator of another pixel of the sensor.

The foregoing and other features and advantages will be discussed in detail in the following non-limiting description of specific embodiments in connection with the accompanying drawings.

DETAILED DESCRIPTION

For clarity, the same elements have been designated with the same reference numerals in the various drawings and, further, the various timing diagrams are not to scale. It should further be noted that in the present description, when pixel or image sensor architectures are described, term "connected" is used to designate a direct electric connection, with no intermediate electronic component, for example, by means of a conductive track, and term "coupled" is used to designate an electronic connection which may be direct or via one or a plurality of intermediate components, for example, via one or a plurality of MOS transistors.

Figures 1, 2:
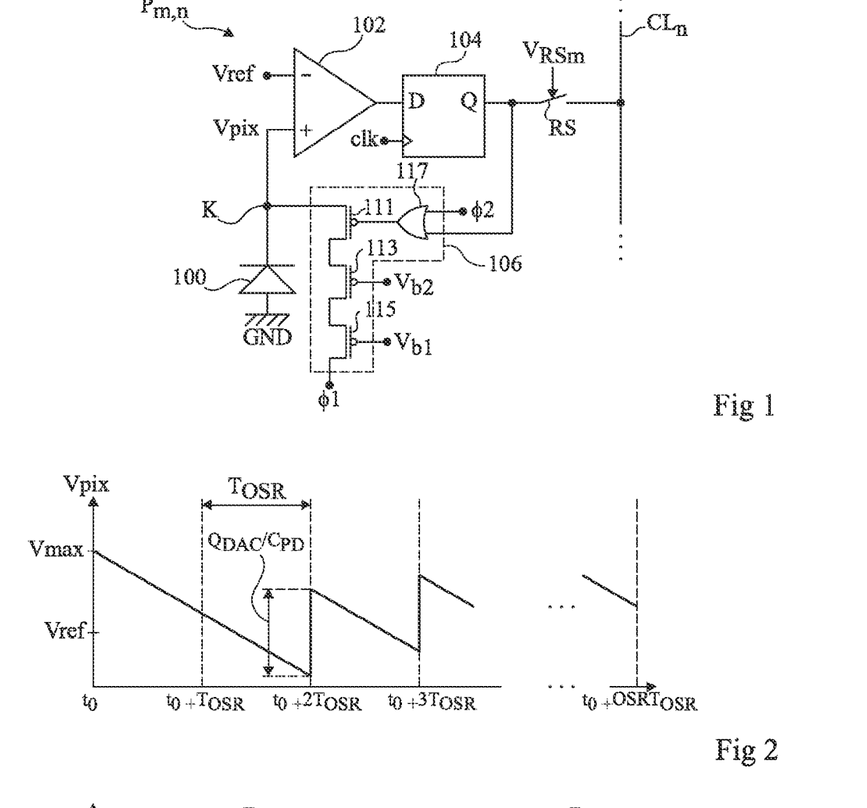
FIG. 1 is a partial electric diagram of an example of a CMOS image sensor.
FIG. 2 is a timing diagram showing the variation of an analog voltage across a photodiode of a pixel of the sensor of FIG. 1.

FIG. 1 is a partial electric diagram of an example of a CMOS image sensor. The sensor of FIG. 1 comprises a plurality of identical or similar pixels. As an example, the sensor of FIG. 1 comprises M*N pixels $P_{m,n}$ arranged in an array of M rows and N columns, M and N being integers greater than 1, m being an integer in the range from 1 to M, and n being an integer in the range from 1 to N. In FIG. 1, for simplification, a single pixel $P_{m,n}$ of the sensor has been shown.

Pixel $P_{m,n}$ comprises a reverse-biased photodiode 100 having its anode connected to a node of application of a reference voltage GND, for example, the ground, and having its cathode connected to a photogenerated charge storage node K. Pixel $P_{m,n}$ further comprises a comparator 102 with two analog inputs and one binary output. An input (+) of comparator 102 is connected to node K, and the other input (−) of comparator 102 is connected to a node of application of a reference voltage $V_{ref}$. Comparator 102 for example comprises an operational amplifier assembled as a voltage comparator, having an inverting input coupled to the node of application of reference potential $V_{ref}$, and having a non-inverting input coupled to node K. The comparator output is coupled to a D binary data input of a flip-flop 104. In the shown example, flip-flop 104 of pixel $P_{m,n}$ further comprises an input of application of a clock signal clk, and a Q binary data output. The operation of circuit 104 is such that, for each rising edge or for each falling edge of clock signal clk, the binary data present on the D input of flip-flop 104 are copied on its Q output. Pixel $P_{m,n}$ further comprises a circuit 106 of injection of positive charges on storage node K of photodiode 100. Circuit 106 comprises three P-channel MOS transistors 111, 113, and 115 series-connected between node K and a node of application of a binary control signal Φ1, for example, a voltage. More particularly, in this example, transistor 111 has a first conduction node connected to node K and a second conduction node connected to a first conduction node of transistor 113, transistor 113 has a second conduction node connected to a first conduction node of transistor 115, and transistor 115 has a second conduction node connected to the node of application of voltage Φ1. Transistor 115 has its control gate connected to a node of application of a fixed bias voltage $V_{b1}$, and transistor 113 has its control gate coupled to a node of application of a fixed bias voltage $V_{b2}$. Circuit 106 further comprises an OR logic gate 117 with two inputs and one output, having its output coupled to the control gate of transistor 111, and having its inputs respectively coupled to the Q output of flip-flop 104 and to a node of application of a binary control signal Φ2, for example, a voltage.

Thus, in the example of FIG. 1, each pixel $P_{m,n}$ of the sensor comprises a synchronous sigma-delta modulator of order 1, having its integrator formed by the capacitance of photodiode 100 of the pixel. Comparator 102 and flip-flop 104 form the low-resolution analog-to-digital conversion circuit (1-bit) of the modulator. Circuit 106 or feedback circuit forms the feedback loop of the modulator.

Pixel $P_{m,n}$ further comprises a selection switch RS, for example, a MOS transistor, connecting the Q output of flip-flop 104, that is, the output of the sigma-delta modulator, to an output conductive track $CL_n$ common to all the pixels of the column of rank n of the sensor.

In this example, the pixels of the sensor of FIG. 1 can be activated in read mode row by row, that is, in particular, all the RS selection switches of the pixels $P_{m,n}$ of a same row have their control nodes coupled to a same node of application of a control signal $V_{RSm}$, the control nodes of the RS switches for selecting pixels of different rows being coupled to nodes of application of different control signals.

In the example of FIG. 1, the sensor may comprise one digital filtering circuit (not shown), for example, a digital counter, per sensor pixel column. As an example, in each sensor pixel column, output conductive track $CL_n$ of the column is coupled to an input of the digital filtering circuit of the column.

FIG. 2 is a timing diagram showing the variation of analog voltage $V_{pix}$ on the storage node K of a pixel $P_{m,n}$ of the sensor of FIG. 1, during a phase of acquisition of a high-resolution digital value representative of the illumination level of the pixel (or output value of the pixel). In this example, the pixel illumination is assumed to be constant during the entire acquisition phase.

$T_{OSR}$ is used hereafter to designate the period of oversampling of the sigma-delta converter, that is, the period between two successive binary readings from a same pixel of the sensor. As an illustration, in the above-mentioned case of a sensor having an acquisition rate of 50 images per second, and for a sigma-delta conversion performed with an OSR equal to 1,024, period $T_{OSR}$ is approximately equal to 1/50/1024≈19.5 μs. In this example, the period of clock signal clk is equal to $T_{OSR}$.

At a time t0 of beginning of the acquisition phase, the photodiode has been reset, for example, via charge injection circuit 106 or via a specific pixel reset circuit (not shown), and voltage $V_{pix}$ is at a high positive value $V_{max}$. Voltage $V_{pix}$ then decreases at a speed representative of the light intensity received by the pixel.

After time t0, for each period of clock signal clk, for example, for each rising edge or each falling edge of signal clk, the binary output value of comparator 102 is stored in flip-flop 104. This value is in a first state, for example corresponding to binary value '0' if, at the clock edge, voltage $V_{pix}$ is smaller than reference voltage $V_{ref}$, and is in a second state, for example corresponding to binary value '1', if, at the clock edge, voltage $V_{pix}$ is greater than voltage $V_{ref}$.

Before the next clock period, the output value of flip-flop 104 is read via output conductive track $CL_n$ of the pixel. Further, before the next clock period, if the output value of flip-flop 104 indicates that voltage $V_{pix}$ is smaller than voltage $V_{ref}$, feedback circuit 106 is controlled to inject onto node K a predetermined quantity of positive charges $Q_{DAC}$. In this case, voltage $V_{pix}$ is incremented by a value equal to $Q_{DAC}/C_{PD}$, where $C_{PD}$ designates the capacitance of node K, or capacitance of photodiode 100. If, however, the output value of flip-flop 104 indicates that voltage $V_{pix}$ is greater than reference voltage $V_{ref}$, feedback circuit 106 injects no charges into the photodiode.

The above-mentioned steps of storing and reading the output binary value of comparator 102, and, according to the stored value, injecting or not a charge packet $Q_{DAC}$ into photodiode 100, are periodically repeated OSR times, at the frequency of clock signal clk (equal to $1/T_{OSR}$).

The OSR binary digital values read during the acquisition phase are integrated in the digital filtering circuit coupled to pixel $P_{m,n}$, to provide a high-resolution digital output value of the pixel.

Figure 3A:
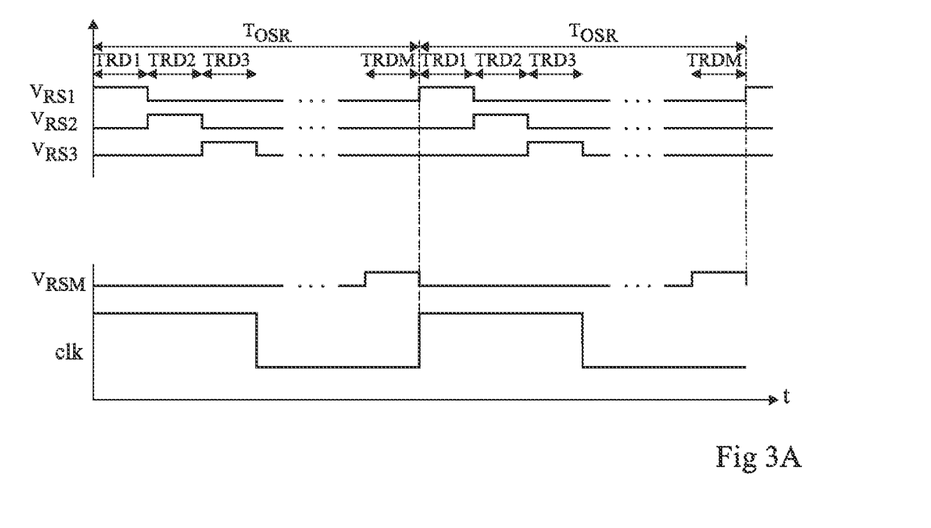
FIGS. 3A and 3B are timing diagrams illustrating an example of a method of controlling the sensor of FIG. 1.
Figure 3B:
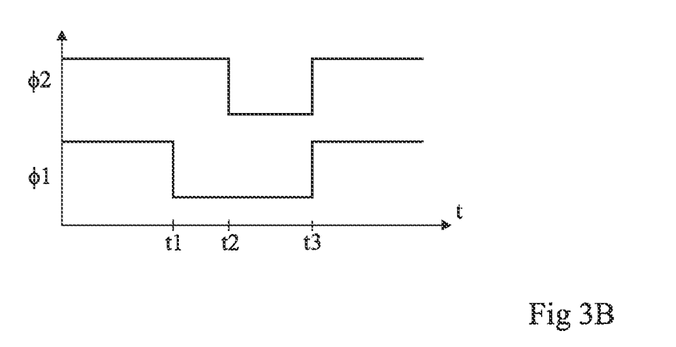

FIGS. 3A and 3B are timing diagrams illustrating in further detail an example of a method of controlling the sensor of FIG. 1.

In this example, the sensor pixels are read row by row at low resolution (1-bit), all the rows being scanned OSR times to provide OSR 1-bit images per pixel. A final high-resolution image is reconstructed by the digital filtering circuits, based on the OSR binary images. In this example, the phases of integration of all the sensor pixels simultaneously start, and the steps of low-resolution quantization of the integrated signal (via the analog-to-digital converter formed by comparator 102 and flip-flop 104), of digital-to-analog conversion of the low-resolution signal (via circuit 106), and of subtracting the feedback signal from the integrated signal (via circuit 106), are carried out simultaneously for all the sensor pixels.

At each period $T_{OSR}$, all the sensor rows are successively read from according to a rolling shutter reading mode.

This is illustrated in FIG. 3A, which shows the time variation of clock signal clk (common to all the sensor pixels), and of control signals $V_{RS1}$, $V_{RS2}$, $V_{RS3}$, . . . , $V_{RSM}$, respectively applied to the control nodes of the RS selection switches of the pixels of the M sensor rows.

As appears in FIG. 3A, each period of clock signal clk, of duration $T_{OSR}$, which corresponds to a phase of acquisition of a binary image (for example, between two successive rising edges of clock signal clk), is divided into M successive periods $T_{RD1}$, $T_{RD2}$, $T_{RD3}$, . . . , $T_{RDM}$, for example, equal to $T_{OSR/M}$. For each period $T_{RDm}$, one of the sensor pixel rows is activated in read mode, by the turning on of the RS selection switches of the row pixels (signal $V_{RSm}$ of the row in the high state in this example), the RS switches for selecting the pixels of the other sensor rows being maintained off. The binary output values of the N pixels in the row are read simultaneously, via conductive tracks $CL_n$, by the filtering circuits coupled to tracks $CL_n$.

Further, for each period $T_{OSR}$, for example, during period $T_{RD1}$ of reading from the first sensor pixel row, a phase of analog-to-digital conversion of the output signal of flip-flop 104, and of injecting back the resulting analog signal into the integrator formed by the photodiode, is simultaneously implemented in all the sensor pixels, via the respective pixel circuits 106. This phase, which will be called feedback phase hereafter, is detailed in FIG. 3B.

FIG. 3B more specifically illustrates the time variation of control signals ϕ1 and ϕ2 (common to all the sensor pixels) of circuits 106 of the sensor pixels.

In the shown example, during a pre-charge phase prior to the actual feedback phase, signal ϕ2 is first set to the high state, whereby transistor 111 is non-conductive. During the pre-charge phase, signal ϕ1 is also set to the high state, which causes the storage of positive charges under the gate of PMOS transistor 113.

At a time t1 of beginning of the feedback phase, signal ϕ1 is set to the low state, signal ϕ2 being maintained in the high state, whereby a quantity of positive charges $Q_{DAC} \approx C_{ox113}*W_{113}*L_{113}*(V_{b1}-V_{b2})$, isolated from the node of application of signal ϕ1, remains trapped under the gate of transistor 113, where $C_{ox113}$, $W_{113}$, and $L_{113}$ respectively designate the surface capacitance defined by the gate oxide of transistor 113, the gate width of transistor 113, and the gate length of transistor 113.

At a time t2 subsequent to time t1, signal ϕ2 is set to the low state, signal ϕ1 being maintained in the low state. As a result, if the output of flip-flop 104 is in the low state ($V_{pix} \leq V_{ref}$), transistor 111 is turned on, which causes the transfer, onto node K, of charge packet $Q_{DAC}$ stored under the gate of transistor 113. If, however, the output of flip-flop 104 is in the high state ($V_{pix} > V_{ref}$), transistor 111 remains off, and no charge is injected into the photodiode by circuit 106.

At a time t3 subsequent to time t2, marking the end of the feedback phase, signals ϕ1 and ϕ2 are set back to the high state, to recharge feedback circuit 106 for the next feedback phase.

An advantage of the sensor described in relation with FIGS. 1, 2, 3A, and 3B is that, due to the synchronous nature of the "rolling shutter"-type reading, the digital filtering circuits of the analog-to-digital converters may be transferred outside of the pixels, and shared by a plurality of sensor pixels. Further, the output signals of the pixels are digital signals, and are thus relatively robust to parasitic disturbances and to technological non-idealities.

As a variation, an asynchronous architecture where the output of comparator 102 is coupled to transistor 111 by an intermediate circuit enabling to generate a voltage pulse when voltage $V_{pix}$ of node K becomes smaller than reference voltage $V_{ref}$ may be provided. In this case, flip-flop 104 is no longer on the modulator feedback path, and may be an asynchronous flip-flop. This flip-flop enables to store the event, if it has occurred during a period $T_{OSR}$, to be read synchronously during a "rolling shutter" type reading (the flip-flop being then reset at the end of each period $T_{OSR}$). An example of such an intermediate circuit for an asynchronous charge reset is discussed in above-mentioned article A.

A problem which may arise in the architecture described in relation with FIGS. 1, 2, 3A, and 3B, is that the pixel array scan frequency during the reading of the binary output data of the pixels, in the order of $M/T_{OSR}$, is relatively high, which causes a relatively significant power consumption and may, in certain cases, result in reading errors.

To decrease the pixel reading frequency, it should be possible to decrease the OSR, that is, the number of binary images used to generate a high-resolution final image. To be able to decrease the OSR without significantly increasing the noise contained in the final image, it may be provided, in each pixel of the sensor of FIG. 1, to replace a sigma-delta modulator of order 1 with a sigma-delta modulator of order greater than 1, for example, a sigma-delta modulator of order 2.

A sigma-delta modulator of order p, p being an integer greater than 1, differs from a sigma-delta modulator of order 1 essentially in that it comprises p analog integrators, generally series-coupled upstream of the low-resolution analog-to-digital converter, instead of a single one. The modulator feedback signal may be injected back either onto the input of the first integrator only, or onto the input of the first integrator and onto the input of one or a plurality of the next integrators, possibly with different weighting coefficients.

By increasing the order of the sigma-delta modulator, it is possible, for identical quantization resolutions and for identical quantization noise levels, to significantly decrease the OSR of the sigma-delta converter. As an illustration, in the above-mentioned case of a quantization over 10 bits, the replacing of a modulator of order 1 with a modulator of order 2 enables to decrease the OSR by a factor approximately equal to 10, without decreasing the signal-to-noise ratio. Thus, to obtain a satisfactory signal-to-noise ratio with a sigma-delta converter of order 2, an OSR approximately equal to 100 would be sufficient, which would enable to decrease by a factor approximately equal to 10 the scan frequency of the sensor in an architecture of the type described in relation with FIGS. 1, 2, 3A, and 3B.

However, sigma-delta modulators are all the more bulky as their order is high, particularly due to the increase in the number of analog integrators that they comprise. The integration of a sigma-delta modulator of high order within an image sensor pixel may thus raise an issue.

Figure 4:
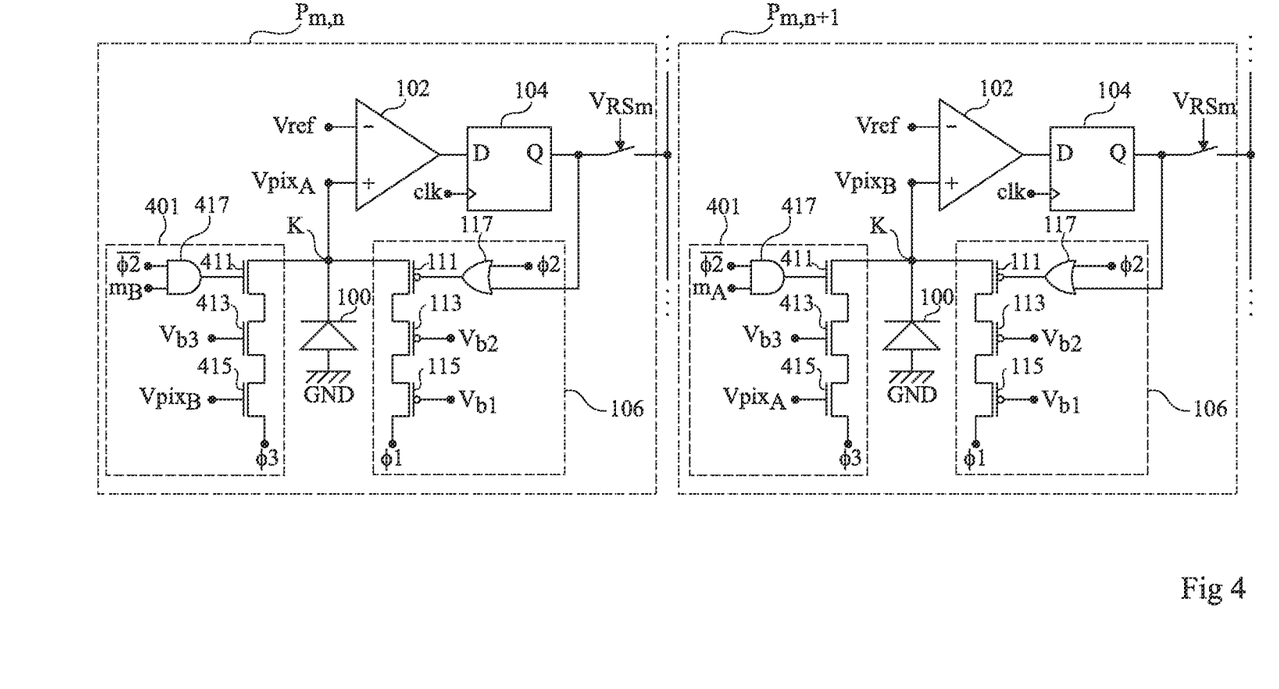
FIG. 4 is a partial electric diagram of an embodiment of a CMOS image sensor.

FIG. 4 is a partial electric diagram of an embodiment of a CMOS image sensor. The sensor of FIG. 4 comprises a plurality of identical or similar pixels, for example arranged in an array of rows and columns. In the sensor of FIG. 4, as will be explained in further detail hereafter, the pixels are interconnected two by two. In this example, a sensor comprising an array of M×N pixels $P_{m,n}$, where M*N is an even number, is considered. The sensor comprises M*N/2 groups of two interconnected pixels. The pixels of a same group are preferably next to one another. Further, the pixels of a same group are preferably arranged to be read simultaneously. In this example, the pixels can be activated in read mode row by row, and the pixels of a same group of interconnected pixels are neighboring pixels of a same pixel row (in this example, number N of sensor pixel columns is even). For simplification, only two pixels $P_{m,n}$ and $P_{m,n+1}$ of a same group of interconnected pixels, belonging to a same row of rank m of the sensor and to neighboring columns of ranks n and n+1, have been shown in FIG. 4.

In this example, each pixel of the sensor of FIG. 4 comprises substantially the same elements as a pixel of the sensor of FIG. 1, that is, a photodiode 100, a comparator 102, a synchronous storage circuit 104, a feedback circuit 106, and a selection switch RS, arranged substantially in the same way as in the example of FIG. 1. These elements will not be detailed again hereafter.

Each pixel of the sensor of FIG. 4 further comprises a configurable connection circuit 401, enabling to couple the sigma-delta modulator of order 1 of the pixel to the sigma-delta modulator of order 1 of the other pixel of the same group of interconnected pixels, to form a sigma-delta modulator of order 2. In this example, connection circuit 401 comprises three N-channel MOS transistors 411, 413, and 415 series-connected between node K of the pixel and a node of application of a binary control signal Φ3, for example, a voltage. More particularly, in this example, transistor 411 has a first conduction node connected to node K of the pixel and a second conduction node connected to a first conduction node of transistor 413, transistor 413 has a second conduction node connected to a first conduction node of transistor 415, and transistor 415 has a second conduction node connected to the node of application of voltage Φ3. In each pixel, transistor 415 has its control gate coupled to node K of the other pixel of the same group of interconnected pixels. Transistor 413 has its control gate coupled to a node of application of a fixed bias voltage $V_{b3}$. In this example, circuit 401 further comprises an AND logic gate 417 with two inputs and one output. The output of gate 417 is connected to the control gate of transistor 411, a first input of gate 417 is coupled to a node of application of a binary control signal $\overline{\Phi2}$ complementary to signal Φ2 (the first input of gate 417 is for example connected to the node of application of control signal Φ2 via an inverter, not shown), and the second input of gate 417 is connected to a node of application of a binary configuration signal, for example, a voltage. The binary configuration signals of the first and second pixels of a same group of interconnected pixels are controllable independently from each other, and are respectively designated with references $m_B$ for a first pixel in the group (pixel $P_{m,n}$ in the shown example) and $m_A$ for the other pixel in the group (pixel $P_{m,n+1}$ in the shown example). As an example, logic configuration signals $m_A$ and $m_B$ are common to all groups of interconnected pixels of the sensor. Further, in this example, bias voltages $V_{b1}$, $V_{b2}$, and $V_{b3}$ are common to all the sensor pixels, and control signals Φ1, Φ2, and Φ3, as well as clock signal clk, are common all the sensor pixels.

When configuration signals $m_A$ and $m_B$ are in the low state, transistors 411 of connection circuits 401 of pixels $P_{m,n}$ and $P_{m,n+1}$ are non-conductive, and the sigma-delta modulators of order 1 of pixels $P_{m,n}$ and $P_{m,n+1}$ are thus isolated from each other. In other words, in each group of interconnected pixels, the sigma-delta modulators of order 1 of the first and second pixels of the group operate independently. The sensor can then operate identically or similarly to what has been described in relation with FIGS. 1, 2, 3A, and 3B.

When configuration signals $m_A$ and $m_B$ are respectively in the high state and in the low state, transistor 411 of connection circuit 401 of pixel $P_{m,n}$ is maintained blocked whatever the state of control signal Φ2. However, transistor 411 of the connection circuit of pixel $P_{m,n+1}$ may be turned on via control signal $\overline{\Phi2}$. Connection circuit 401 of pixel $P_{m,n+1}$ then enables to inject, into the integrator of the sigma-delta modulator of order 1 of pixel $P_{m,n+1}$, that is, onto node K of pixel $P_{m,n+1}$, a signal representative of the quantization error of the modulator of order 1 of pixel $P_{m,n}$. The sigma-delta modulators of order 1 of pixels $P_{m,n}$ and $P_{m,n+1}$ then form together a sigma-delta modulator of order 2.

Such a sigma-delta modulator of order 2, formed by the series connection of two modulators of order 1 each comprising an analog integrator, a low-resolution analog-to-digital converter, and a feedback loop, is generally called MASH (Multi Stage Noise Shaping) modulator. The operating principle of MASH-type sigma-delta modulators is for example described in article "Sturdy MASH Δ-Σ modulator" of Maghari et al. (ELECTRONICS LETTERS 26th Oct. 2006 Vol. 42 No. 22), which is incorporated herein by reference. In such a modulator, a first modulator of order 1, or upstream modulator, receives the analog signal to be digitized on its analog input, and the second modulator of order 1, or downstream modulator, receives on its analog input a signal representative of the quantization error of the first modulator of order 1. During a phase of acquisition of a high-resolution digital value representative of an analog input signal, each of the modulators of order 1 delivers a train of OSR bits at the output of its low-resolution analog-to-digital converter, the two bit trains being recombined in a single train of OSR bits by a digital recombination circuit, and then digitally integrated by a digital filtering circuit generating, from the recombined bit train, a high-resolution digital value representative of the analog input signal of the upstream modulator. More generally, MASH-type topologies can be applied whatever the order of the series-connected elementary modulators, and whatever the number of series-coupled elementary modulators. The elementary modulators are then coupled so that each modulator of the series association of elementary modulators, except for the first elementary modulator, receives on its analog input a signal representative of the quantization error of the previous modulator. An advantage of MASH-type sigma-delta modulators is that they enable to obtain high modulation orders, by doing away with problems usually encountered (particularly, instability problems) in the forming of conventional sigma-delta modulators of high orders (comprising a plurality of series-connected analog integrators but a single analog-to-digital converter and a single feedback loop).

In the example of FIG. 4, when configuration signals $m_A$ and $m_B$ are respectively in the high state and in the low state, the modulator of order 1 of pixel $P_{m,n}$ is the upstream modulator of the MASH structure. During a phase of acquisition of a high-resolution digital output value of the group comprising pixels $P_{m,n}$ and $P_{m,n+1}$, each of the modulators of order 1 of pixels $P_{m,n}$ and $P_{m,n+1}$ outputs a bit train via output track $CL_n$, respectively $CL_{n+1}$, of the pixel. The two bit trains may be recombined in a single bit train via a recombination circuit, not shown, for example, arranged at the foot of a column. The recombined bit train is then provided to a digital filtering circuit capable of generating a high-resolution digital output value representative of the illumination levels received by pixels $P_{m,n}$ and $P_{m,n+1}$, weighted by different coefficients. More specifically, for the group comprising pixels $P_{m,n}$ and $P_{m,n+1}$, a high-resolution digital output value representative of signal $\alpha I(P_{m,n}) + \beta I(P_{m,n+1})$ is obtained, where $I(P_{m,n})$ and $I(P_{m,n+1})$ respectively designate the light intensity received by pixel $P_{m,n}$ and the light intensity received by pixel $P_{m,n+1}$, and where $\alpha$ and $\beta$ are different weighting coefficients, with $\alpha > \beta$ (the illumination level received by the upstream pixel of the group is indeed preponderating over the illumination level received by the downstream pixel of the group in the output value of the sigma-delta converter of order 2). In the present description, the recombination circuits and the digital filtering circuits have not been described, the described embodiments being compatible with usual recombination and digital filtering circuits, used in existing sigma-delta converters.

When configuration signals $m_A$ and $m_B$ are respectively in the low state and in the high state, the operation is similar to what has just been described, but for the fact that the sigma-delta modulator of order 1 of pixel $P_{m,n+1}$ is located upstream of the sigma-delta modulator of order 1 of pixel $P_{m,n}$ in the MASH structure. The high-resolution digital output value of the sigma-delta converter is then representative of signal $\alpha I(P_{m,n+1}) + \beta I(P_{m,n})$.

Thus, to acquire a complete image via the sensor of FIG. 4, a first phase of acquisition of a partial digital image of size M*N/2 may be provided, during which configuration signals $m_A$ and $m_B$ are respectively in the high state and in the low state. During this first acquisition phase, for each group of two interconnected pixels P1 and P2 of the sensor, a high-resolution digital output value representative of signal $\alpha I(P1) + \beta I(P2)$ is acquired. A second phase of acquisition of a partial digital image of size M*N/2 can then be implemented, during which configuration signals $m_A$ and $m_B$ are respectively in the low state and in the high state (that is, in each group of pixels, the upstream pixel and the downstream pixel are interchanged). During this second acquisition phase, for each group of interconnected pixels of the sensor, a high-resolution digital output value representative of signal $\alpha I(P2) + \beta I(P1)$ is acquired. For each group of interconnected pixels, a system of two equations with two unknowns, enabling to determine a high-resolution digital value representative of the illumination level I(P1) of the first pixel in the group and a high-resolution digital value representative of the illumination level I(P2) of the second pixel in the group, are then obtained. Thus, the two acquired partial images may be combined to form a complete digital image, of size M*N.

In the example of FIG. 4, when the sensor is configured to perform a sigma-delta analog-to-digital conversion of order 2, each of the first and second phases of acquisition of a partial image of size M*N/2 comprises OSR successive scannings of the M sensor rows. Thus, the acquisition of a complete image comprises 2*OSR successive scannings of the M sensor rows. However, as indicated hereabove, the passing from a sigma-delta modulator of order 1 to a sigma-delta modulator of order 2 enables to decrease the OSR by a significant factor, for example, by a factor 10, without decreasing the signal-to-noise ratio at the output of the analog-to-digital converter. Thus, in the sensor of FIG. 4, for a given image acquisition duration, the sensor row scan frequency may be decreased by a factor 5 with respect to a sensor having the same number of rows but performing a sigma-delta analog-to-digital conversion of order 1, for example, a sensor of the type described in relation with FIG. 1. Such orders of magnitude are of course an illustration only and should not be considered as a limitation.

As a variation, in certain applications for which the full resolution of the sensor is not indispensable, it is possible to provide a single phase of acquisition of a partial image of size M*N/2, during which the sensor is configured to perform a sigma-delta analog-to-digital conversion of order 2 ($m_A$ and $m_B$ respectively being in the high state and in the low state or in the low state and in the high state). In this case, each point of the image of size M*N/2 has a value representative both of the illumination of the first pixel in the corresponding group of interconnected pixels, and of the illumination of the second pixel in the corresponding group of interconnected pixels. This for example enables to increase by a factor 2 the image acquisition rate.

An example of a method of controlling the sensor of FIG. 4 will now be detailed. More specifically, the example of control method detailed hereafter corresponds to a first phase of acquisition of a partial image of size M*N/2, the sensor being configured to perform a sigma-delta analog-to-digital conversion of order 2. As an example, the case where configuration signals $m_A$ and $m_B$ are respectively in the high state and in the low state is considered. An identical or similar control method may however be implemented during the phase of acquisition of the second portion of the image (configuration signals $m_A$ and $m_B$ being then respectively in the low state and in the high state).

During the phase of acquisition of the first image portion, the sensor pixels are read row by row at low resolution (1-bit), all the rows being scanned OSR times to provide, for each group of interconnected sensor pixels, two trains of OSR bits. In each group of pixels, the two trains of OSR bits are recombined by a recombination circuit, not shown, into a single train of OSR bits representative both of the photocurrent generated in the photodiode of the upstream pixel of the group (pixel $P_{m,n}$ in the shown example) and of the photocurrent generated in the photodiode of the downstream pixel of the group (pixel $P_{m,n+1}$ in this example). A high-resolution output value of the group comprising pixels $P_{m,n}$ and $P_{m,n+1}$ is output, based on this recombined bit train, by the digital filtering circuits (not shown).

In this example, the integration phases of all the sensor pixels start simultaneously, and the low-resolution quantization phases of the analog signals, as well as the feedback phases (including the transfer of the quantization error of the upstream modulator of order 1 in the analog integrator of the downstream modulator of order 1) are simultaneously carried out in all the sensor pixel groups.

At each period $T_{OSR}$, all the sensor rows are successively read from according to a rolling shutter reading mode, identically or similarly to what has been described in relation with FIG. 3A.

As in the example of FIG. 3A, each period of clock signal clk, of duration $T_{OSR}$ (for example, between two successive rising edges of clock signal clk), is divided into M successive periods $T_{RD1}$, $T_{RD2}$, $T_{RD3}$, ..., $T_{RDM}$, for example, equal to $T_{OSR}/M$. For each period $T_{RDm}$, one of the sensor pixel rows is activated in read mode, by the turning on of the RS selection switches of the row pixels (signal $V_{RSm}$ of the row in the high state in this example), the RS switches for selecting the pixels of the other sensor rows being maintained off. The binary output values of the N pixels in the row are simultaneously read, via conductive tracks $CL_n$, by the filtering circuits coupled to tracks $CL_n$.

Further, for each period $T_{OSR}$, for example, during period $T_{RD1}$ of reading from the first row of sensor pixels, a phase, which will be called feedback phase hereafter, is simultaneously implemented in all the interconnected pixel groups of the sensor. During the feedback phase, in each of the pixels of the group of interconnected pixels, the output signal of the low-resolution analog-to-digital converter of the pixel (that is, the output signal of flip-flop 104 of the pixel) is converted into an analog signal and subtracted from the signal integrated by the pixel photodiode (via circuit 106 of the pixel). Further, during this feedback phase, a signal representative of the signal integrated in the photodiode of the upstream pixel of the group (pixel $P_{m,n}$ in this example) is injected into the photodiode of the downstream pixel of the group (pixel $P_{m,n+1}$ in this example), via connection circuit 401 of the downstream pixel.

Figure 5:
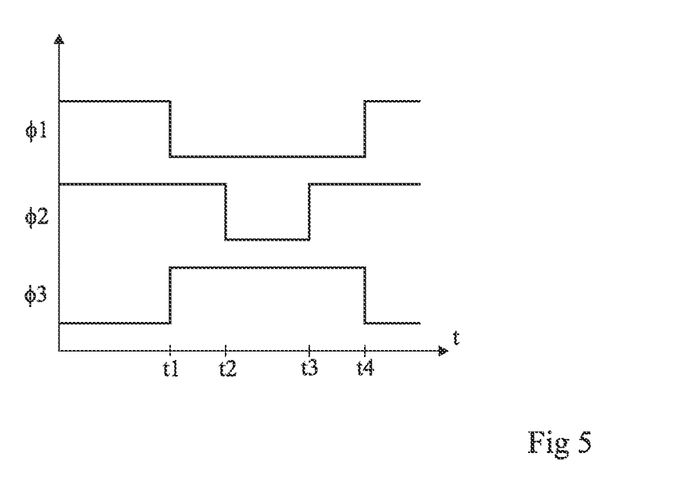
FIG. 5 is a timing diagram illustrating an example of a method of controlling the sensor of FIG. 4.

FIG. 5 is a timing diagram illustrating in further detail the way in which the feedback phase is carried out. More particularly, FIG. 5 schematically shows the time variation of control signals $\phi1$, $\phi2$, and $\phi3$ (common to all the sensor pixels) of circuits 106 and 401 of the sensor pixels, during the feedback phase.

In the shown example, during a pre-charge phase prior to the actual feedback phase, signals $\phi1$ and $\phi2$ are set to the high state, and signal $\phi2$ is set to the low state. As a result, in all the sensor pixels, transistors 111 and 411 are in the off state. Thus, in all the sensor pixels, positive charges (holes) are stored under the gate of transistor 113, and negative charges (electrons) are stored under the gate of NMOS transistor 413.

At a time t1 of beginning of the feedback phase, signals $\phi1$ and $\phi3$ are respectively set to the low state and to the high state, signal $\phi2$ being maintained in the high state. As a result, in all the sensor pixels, a quantity of positive charges $Q_{DAC} \approx C_{ox113}*W_{113}*L_{113}*(V_{b1}-V_{b2})$, isolated from the node of application of signal $\phi1$, remains trapped under the gate of transistor 113. Further, in each group of interconnected pixels of the sensor, in the upstream pixel of the sigma-delta modulator of order 2 (pixel $P_{m,n}$ in this example), a quantity of negative charges $Q_A$ proportional to $V_{pixB}-V_{b3}$ (approximately equal to $C_{ox413}*W_{413}*L_{413}*(V_{pixB}-V_{b3})$, where $C_{ox413}$, $W_{413}$, and $L_{413}$ respectively designate the surface capacitance defined by the gate oxide of transistor 413, the gate width of transistor 413, and the gate length of transistor 413, and where $V_{pixB}$ designates the potential of node K of the downstream pixel, that is, of pixel $P_{m,n+1}$ in this example), isolated from the node of application of signal $\phi2$, remains trapped under the gate of transistor 413. Further, in the downstream pixel of the modulator of order 2 (pixel $P_{m,n+1}$ in this example), a quantity of negative charges $Q_B$ proportional to $V_{pixA}-V_{b3}$ (approximately equal to $C_{ox413}*W_{413}*L_{413}*(V_{pixA}-V_{b3})$, where $V_{pixA}$ designates the potential of node K of the upstream pixel, that is, of pixel $P_{m,n}$ in this example), isolated from the node of application of signal $\phi2$, remains trapped under the gate of transistor 413.

At a time t2 subsequent to time t1, signal $\phi2$ is set to the low state, signals $\phi1$ and $\phi2$ being respectively maintained in the low state and in the high state. As a result, in each sensor pixel, if the output of flip-flop 104 is in the low state ($V_{pix}<V_{ref}$), transistor 111 of the pixel is turned on, which causes the transfer, onto node K of the pixel, of charge packet $Q_{DAC}$ stored under the gate of transistor 113 of the pixel. If, however, the output of flip-flop 104 is in the high state ($V_{pix}>V_{ref}$), transistor 111 remains non conductive, and no charge is injected into the photodiode by circuit 106. Further, in each group of sensor pixels, transistor 411 of the downstream pixel of the sigma-delta modulator of order 2 (pixel $P_{m,n+1}$ in the shown example) is turned on, which causes the transfer, onto node K of the downstream pixel, of the quantity of negative charges stored under the gate of transistor 413 of this pixel (proportional to the signal integrated in the photodiode of the upstream pixel, representative of the quantization error of the modulator of order 1 of the upstream pixel). Configuration signal $m_B$ being in the low state, transistor 411 of the upstream pixel of the modulator of order 2 (pixel $P_{m,n}$ in this example) remains off, and no charge is injected into the photodiode of this pixel via circuit 401 of this pixel.

At a time t3 subsequent to time t2, marking the end of the feedback phase, signal $\phi2$ is set back to the high state to isolate, in each sensor pixel, charge injection circuits 106 and 401 of node K of the pixel. At time t3 or at a time t4 subsequent to time t3, signals $\phi1$ and $\phi3$ may be respectively set to the high state and to the low state, to recharge circuits 106 and 401 for the next feedback phase.

It should be noted that in the example of FIG. 4, the coefficients of the modulator of order 2 may be set by the size of transistors 113 and 413 of charge injection circuits 106 and 401. Thus, transistors 113 and 413 may have different charge storage capacities. In particular, the charge storage capacity of transistor 413 may be selected to be relatively high, so that, during the feedback phase, the quantity of negative charges injected into photodiode 100 of the downstream pixel of the modulator of order 2, by the connection circuit 401 of this pixel, is preponderating over the quantity of charges photogenerated in the photodiode of this pixel for each period $T_{OSR}$.

In addition to the advantages already described in relation with FIGS. 1, 2, 3A, and 3B, the embodiment of FIG. 4 has the advantage of enabling, without significantly increasing the bulk and the complexity of the sensor pixels, to significantly decrease the pixel scan frequency with respect to a sensor of the type described in relation with FIG. 1 (for identical image acquisition times, identical quantization resolutions, and identical quantization noise levels).

Specific embodiments have been described. Various alterations, modifications, and improvements will readily occur to those skilled in the art.

In particular, the described embodiments are not limited to the specific example of FIG. 4 where each pixel comprises a sigma-delta modulator of order 1, the pixels being interconnected in groups of two pixels, the modulators of the pixels of a same group being capable of being coupled to form a modulator of order 2. More generally, according to an aspect of the described embodiments, each pixel comprises a modulator of order p equal to or greater than 1, and the pixels are interconnected in groups of q pixels, q being equal to or greater than 2, the pixels of a same group being capable of being coupled to form a modulator of order p*q.

Further, the described embodiments are not limited to the specific examples of feedback and connection circuits 106 and 401 described in relation with FIG. 4. In particular, it will be within the abilities of those skilled in the art to adapt the described embodiments to replace feedback and connection circuits 106 and 401 described in relation with FIG. 4 with other circuits, for example, circuits capable of performing a voltage recharge or a current discharge of node K of the pixel.

Further, the described embodiments are not limited to the above-described specific case wherein, in each sensor pixel, the analog integrator of the sigma-delta modulator of the pixel comprises the pixel photodiode. As a variation, one or a plurality of specific additional capacitances may be provided in each pixel to form the analog integrator of the sigma-delta modulator of the pixel.

Further, the described embodiments are not limited to the specific example of low-resolution analog-to-digital converter described hereabove, comprising a comparator 102 and a flip-flop 104 connected to the output of comparator 102. As a variation, the low-resolution analog-to-digital converter may be formed by a 1-bit comparator directly driven by a clock signal or, more generally, by any other adapted low-resolution analog-to-digital conversion circuit.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A CMOS image sensor comprising a plurality of pixels, each comprising:
   a photodiode;
   a sigma-delta modulator of order p, p being an integer greater than or equal to 1, capable of delivering a binary digital signal representative of an illumination level of the photodiode; and
   a configurable connection circuit enabling to couple the sigma-delta modulator of a first pixel of the plurality of pixels to a sigma-delta modulator of another pixel of the plurality of pixels, so that the modulators of the first and second pixels form with each other a sigma-delta modulator of order greater than p.

2. The sensor of claim 1, wherein the pixels are distributed in groups of q pixels, q being an integer greater than or equal to 2, the pixels of a same group being interconnected and circuits for connecting the pixels of a same group being capable of being configured to couple the modulators of order p of the pixels in the group so that the modulators form together a sigma-delta modulator of order q*p.

3. The sensor of claim 1, wherein in each pixel, the sigma-delta modulator of order p of the pixel comprises an analog integrator comprising the photodiode of the pixel.

4. The sensor of claim 3, wherein, in each pixel, the sigma-delta modulator of order p comprises an analog-to-digital converter of an analog output signal of the analog integrator of the pixel.

5. The sensor of claim 4, wherein, in each pixel, the analog-to-digital converter comprises a comparator comparing said output signal with a reference signal.

6. The sensor of claim 4, wherein, in each pixel, the sigma-delta modulator of order p comprises a feed-back circuit connecting an output node of the analog-to-digital converter to a node of the analog integrator of the pixel.

7. The sensor of claim 6, wherein, in each pixel, the feedback circuit is capable of injecting a predetermined quantity of charges into the analog integrator of the pixel.

8. The sensor of claim 7, wherein said charges have a sign opposite to that of photogenerated charges stored in the photodiode of the pixel.

9. The sensor of claim 6, wherein, in each pixel, the feedback circuit comprises first, second, and third P-channel MOS transistors series-connected between the node of the analog integrator of the pixel, and a node of application of a first control signal.

10. The sensor of claim 9, wherein, in each pixel, a control gates of the second and third P-channel MOS transistors are respectively coupled to first and second bias potentials.

11. The sensor of claim 9, wherein, in each pixel, a control gate of the first P-channel MOS transistor is coupled to a node of application of a second control signal and to said output node of the analog-to-digital converter via a logic gate.

12. The sensor of claim 3, wherein, in each pixel, a connection circuit is capable of injecting, onto a node of the analog integrator of the pixel, a quantity of charges representative of an output signal of the analog integrator of another pixel of the sensor.

13. The sensor of claim 12, wherein, in each pixel, the a connection circuit comprises first, second, and third N-channel MOS transistors series-connected between the output node of the analog integrator of the pixel and a node of application of a third control signal.

14. The sensor of claim 13, wherein, in each pixel, a control gates of the second and third N-channel MOS transistors are respectively coupled to a third bias potential and to a node of an analog integrator of another pixel of the sensor.

* * * * *